United States Patent [19]

Burkum et al.

[11] Patent Number: 4,536,704
[45] Date of Patent: * Aug. 20, 1985

[54] APPARATUS FOR IDENTIFYING DEFECTIVE SUBSTATION CAPACITORS

[75] Inventors: Merlin E. Burkum, Elmhurst; Timothy M. O'Regan, Chicago, both of Ill.

[73] Assignee: Commonwealth Edison Company, Chicago, Ill.

[*] Notice: The portion of the term of this patent subsequent to Jan. 10, 2001 has been disclaimed.

[21] Appl. No.: 567,780

[22] Filed: Jan. 3, 1984

[51] Int. Cl.³ ............................................ G01R 31/02
[52] U.S. Cl. ...................................... 324/52; 324/60 R
[58] Field of Search ................ 324/51, 52, 54, 60 R, 324/251, 252, 117 H, 127

[56] References Cited

U.S. PATENT DOCUMENTS

| 1,823,492 | 9/1931 | Houck | 324/54 X |
| 4,234,846 | 11/1980 | Maringer | 324/251 X |
| 4,425,541 | 1/1984 | Burkum | 324/51 |

OTHER PUBLICATIONS

Kahen: "Current Measuring System", IBM Tech. Discl. Bulletin, Sep. 1969, pp. 633–634.

Primary Examiner—Stanley T. Krawczewicz
Assistant Examiner—Jose M. Solis
Attorney, Agent, or Firm—Emrich & Dithmar

[57] ABSTRACT

An apparatus for identifying defective substation capacitors includes a variable power supply section for supplying an alternating electric current to a de-energized substation capacitor bank without disconnecting the individually fused capacitor from the capacitor bus and a second power measurement section for measuring the magnitude of the electric current entering the capacitor being tested.

13 Claims, 2 Drawing Figures

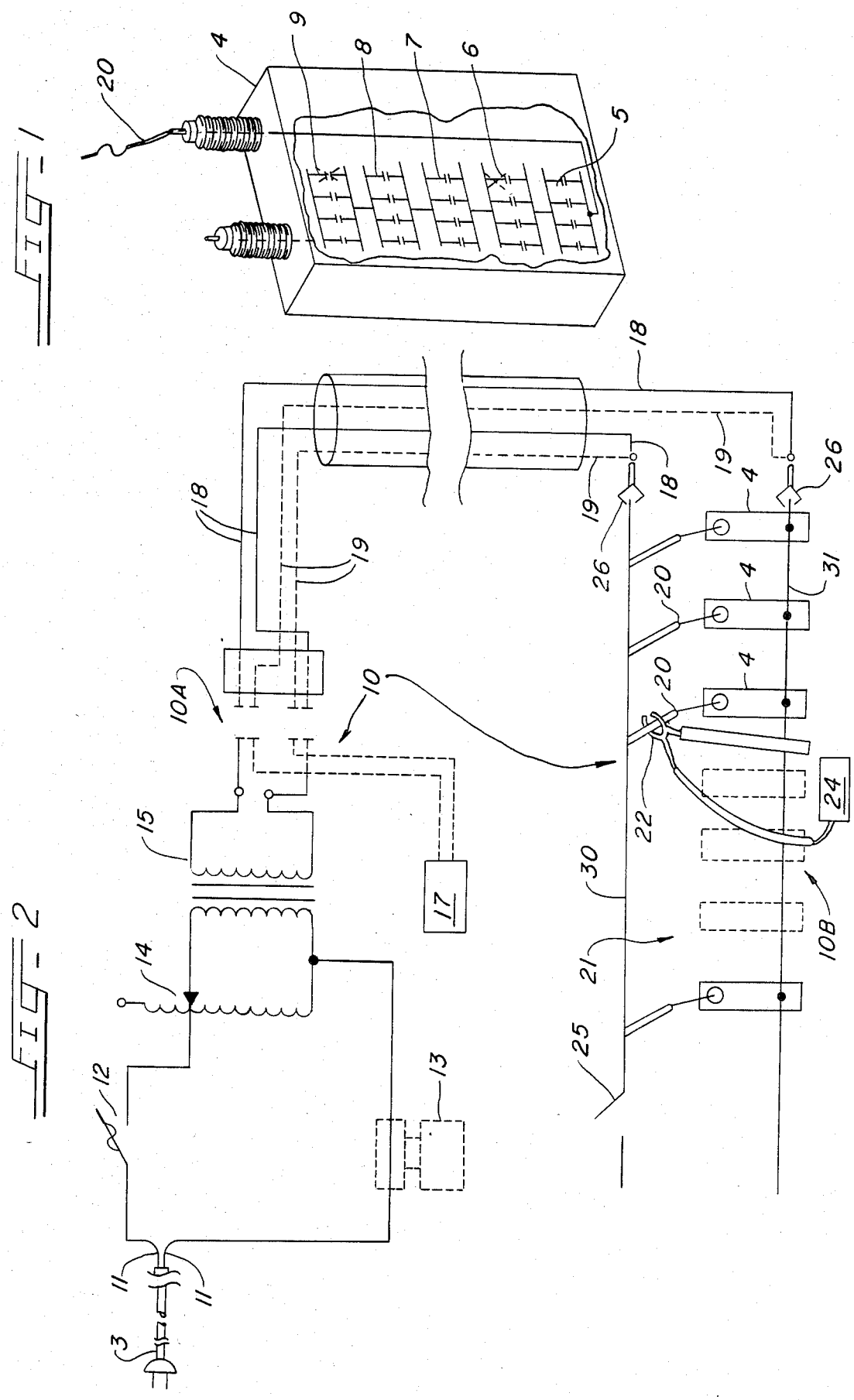

APPARATUS FOR IDENTIFYING DEFECTIVE SUBSTATION CAPACITORS

BACKGROUND OF THE INVENTION

The present invention relates to an apparatus for the in-circuit detection of defective capacitors of the type used on electric power transmission and distribution systems, and particularly of those installed in large numbers as a bank, at a substation in the electric power distribution system.

The shunt connected high voltage distribution type capacitor units are used extensively by the electric utility industry and manufacturing industry in their electrical supply systems for correcting the power factor of the system and maintaining proper range of voltage levels. A common method of construction of these capacitors consists of two sheets of pure aluminum foil separated by layers of kraft paper or plastic film impregnated with chromated aromatic hydrocarbon compounds. A capacitor unit is made up of several of these individual small sized capacitor packs or rolls, which are connected in a parallel-series arrangement in order to obtain the desired capacitance value and withstand the high voltages in the range of 2,000 volts to 20,000 volts. The capacitor unit is enclosed in a sealed metal can, having one or two insulated bushing-type terminals extending from the top. If desired, the second bushing may be omitted, in such a case, the metal can is interconnected with the neutral bus floating mid-point or ground in the system.

The metal can is filled with an insulating liquid. Before 1977, most capacitor cans contained PCB-type non-flammable insulating fluids. However, such materials have been condemned because of excessive toxicity and environmental problems and the more recently, the insulating fluids that have been utilized in place of PCB-type fluids are flammable. Generally, the capacitor cans are connected in the electric transmission and distribution system at various locations in small groups or units close to the load centers, or in much larger groups or banks at substations in the system.

It is important that as many of the capacitor units as possible in an electric transmission and distribution system be in a serviceable condition so that during periods of high electrical load, the system voltage is held within a prescribed range. However, because of periodic failures within the large banks of capacitors installed at substations, at any given time there may be a large number of capacitor units disconnected from the system and awaiting service. In order to compensate for these failed capacitor units, either a surplus of capacitor units over and above the minimum necessary is required, or the generators must supply the additional reactive power at the expense of producing real power. In either case, the result is an unacceptable additional monetary expense.

Prior to the present invention, detection of failed capacitor units by electric utility workmen has been primarily that of a visual observation. A blown fuse is one signal to a workman that one or more capacitor units is out of service. If the workman cannot visually detect a sign of failure, such as a bulged metal can or a leaking seam or bushing, the operating practice has been to re-energize the capacitor unit with a new fuse.

However, the above practice has very serious drawbacks and limitations. Firstly, should the capacitor bank be re-energized when a capacitor unit actually has an electrical short, for which no visual indication is apparent, there is the increased probability of a violent rupture (affecting many adjacent capacitor units) and the release of the dielectric fluid onto the immediate area. Containment of the liquid dielectric fluid within the capacitor can is very important because the capacitor units, containing PCB-type insulating fluids, must not be allowed to contaminate the immediate area. Such contamination results in expensive and time-consuming cleanup procedures and if a violent rupture should occur when workmen are in the vicinity of such a rupture, severe injuries may occur. Additionally, the non PCB-type fluids are flammable and present a fire hazard upon failure.

Secondly, a capacitor unit may have a partial or incipient fault because one or more of the small series group connected packs, making up the total capacitor unit, has shorted or opened. The capacitor unit may withstand the applied line voltage for a short period of time, perhaps hours or weeks, by a redistribution of line voltage across the remaining operative series connected capacitor packs. However, arcing within the shorted capacitor pack or between adjacent capacitor packs may cause the dielectric fluid and insulation to decompose into hydrocarbon gases, thereby bulging the capacitor can and creating a potentially explosive condition when the eventual electrical failure of the capacitor unit occurs. Field experience has shown that once a capacitor is beyond its infancy period, the predominance of field failures are pack failures.

In addition, large installations of capacitors at substations in the power transmission and distribution systems are often connected in a ungrounded wye or three phase configuration, each leg of the wye having many capacitors connected together in a series-parallel arrangement. If too many capacitors fail on one leg of the wye as compared to the other two legs, a shift in voltage will occur resulting in a higher than normal voltage across the leg of the wye having the excess number of failed capacitors. This in turn results in more failed capacitors due to the overvoltage and a possible runaway condition which will trip the entire capacitor bank off the energized bus. For these reasons, it is important that the condition of the capacitors installed in large banks in substations be known.

There have been several suggested methods and apparatuses for determining the condition of a capacitor unit, however, these suggestions all require operations which are beyond the assigned duties, and technical capabilities of the average lineman or mechanic. For example, the USA Standards for Shunt Power Capacitors 0551-1968, describes various field tests for these type capacitor units. One such test requires the application of a known voltage and frequency of undistorted wave shape to the capacitor unit. However, this test of capacitance measurement requires disconnecting each capacitor unit from the remainder of the bank and then individually measuring the current drawn by each unit. Such tests require a high degree of technical competence to interpret the resultant meter readings and the manpower cost associated with such tests are prohibitive. Moreover, the disconnecting and handling of the capacitor unit may indeed cause damage to the capacitor unit which results in incipient faults.

Also, commercially available capacitance meters, which apply a low AC voltage to provide a direct capacitance reading of the capacitor are unreliable on paper film capacitors. The gases created by arcing in a defective unit insulates the defective pack to the voltage applied by the capacitance meter and, therefore, capacitance readings obtained may be in error. It has been observed that for an applied low voltage on a capacitance bridge, that certain known shorted capacitors were erroneously measuring as good units. Such a result indicated that a certain minimum level of voltage was required to break down the gas bubbles adjacent to faulted packs. These particular capacitors were paper film PCB-type liquid units. Repetitive tests showed breakdown of 7,200 volt units at voltages up to 76 volts AC. Use of this device required disconnecting each unit in the capacitor bank during testing, which results in large manpower costs and expensive time loss during testing of the capacitors.

In a previously filed application, U.S. Ser. No. 301,949 filed Sept. 14, 1981 and U.S. Ser. No. 576,783 filed concurrently herewith, by the inventors of the present invention, the inventors have described apparatus which was optimally designed for the detection of faults on capacitors which are installed in groups of two to four on utility poles and protected by a single fuse. The apparatus for the detection of capacitor faults, either incipient or fully developed, when installed in the smaller groups of two-four per phase on utility poles, utilized a transmitter having a power frequency in the order of 50/60 to 800 hertz in order to drive sufficient electric current through capacitors to allow accurate measurement of the charging current at a nominal 120 volts. Because the power source was a portable or a mobile battery/inverter, the economics and practical size limit the applicability of the apparatus to capacitor groups of about four per phase, which is normally sufficient for pole mounted capacitor installations. In addition, because of the method of mounting pole type capacitors, the split-core detection device must be fitted over the large diameter procelain insulator bushings of the capacitor. These applications disclose a sensitive split-core Hall-Effect or special distributed winding split-core detection device. However, a substation capacitor bank size, generally may consist of several hundred cans, with between about 5-40 capacitor units in parallel in a phase to be tested at one time, makes a battery/inverter transmitter impractical and non-economical because of power output requirements.

SUMMARY OF THE INVENTION

It is one object of the present invention to accurately determine the operating condition of a multi-pack, individually fused, high-voltage capacitor unit of the type used at electric power transmission and distribution substations.

It is another object of the present invention to accurately detect incipient-type faults in multipack, individually fused capacitor units of the type used at electric substations.

It is still another object of the present invention to present a simplified and novel operating method for accurately determining and detecting the condition of a capacitor unit which may be readily understood by non-technical distribution system operating personnel.

It is still a further object of the present invention to permit the determination and detection of the condition of each multipack capacitor unit connected in parallel, without disconnecting the paralleled units from one another.

Additionally, another object of the present invention is to provide for the safe operation of the fault detection assembly and procedure for the detection of the condition of a multipack capacitor unit at the installation site.

The present invention, although seemingly simple and straightforward in basic principles, is in reality a carefully coordinated assembled combination of electrical components which match the simplified testing requirements for correctly assessing the operating condition of individually fused power-type capacitors installed in large numbers in series-parallel arrangements at electric substations.

The present invention for station capacitors utilize a somewhat related approach to the fault detection apparatus for pole mounted capacitors; however, because of dissimilarities in the number of capacitors connected to a single bank, the manner of hardware connection and fusing, and general locations of these two different type installations, the present apparatus is uniquely different from the forementioned copending applications. Additionally, capacitors which are installed at substations often have a substantially higher voltage rating than those installed on distribution poles. Capacitors with higher voltage ratings are constructed with more groups of capacitor packs in series, which results in a lower capacitance value for a given physical sized capacitor unit. These higher voltage, lower capacitance units are mounted in much larger groups or in a bank, upwards of several hundred units. Utilizing a 400 hertz inverter transmitter, as disclosed in the aforementioned patent application filed in the name of the present inventors, it is not economically practical for large capacitor banks.

Capacitor cans are connected (in parallel or in series) through individual unit fuses to the substation capacitor bus. Theoretically, the fuse should open for a faulted capacitor unit preventing a violent explosion which would cause the insulating liquid (some containing PCBs) to be splattered around the area. However, experience has shown that explosions still sometimes occur despite the fusing, and it is prudent to detect incipient failures before the capacitor unit proceeds from the incipient fault condition to the final fault failure.

The power capacitor tester assembly is comprised of a transmitter section and a measurement section. The transmitter section consists of a power source, an input circuit breaker, and transformer having a rating sized to the largest number of capacitor units to be tested at one time, with generally between 0.5-2 Kva, adjustable from 0 to 480 volts, an input current measurement circuit, an output voltmeter and electrical conductors to connect the electrical output of the power supply to the power capacitor unit to be tested.

The measurement section consists of a split-core clamp-on transformer (pick-up), matching circuit, and meter for reading the output from the pickup. The pickup device for individual capacitor unit measurements has a special distributed winding capable of accurate readings even though the conductor is not centered in the clamp-on transformer, and also has a high repeatability of measurements through a self-cleaning feature at the interface of the split in the magnetic circuit. One such pickup device having these required features is the AEMC Corporations's model, catalog No. 100.11, as depicted in their catalog Ed 1-64, 1982. It is also desirable to attach the clamp-on pickup device to one end of a hot stick, with the added feature of remote operation from the opposite hot stick end. This permits the operator, standing on the ground, to safely install the split-core around a capacitor lead energized at 480 volts from the transmitter section. The composite transmitter voltmeter, clamp-on split core transformer, matching circuit, and meter should have an overall accuracy of about ±3%.

The operation of the power capacitor tester assembly may be described as follows:

A substantial alternating current electrical power supply is normally found in substations where capacitors are installed, so that unlike testing pole top capacitors at remote locations, a portable battery supply is not required. Normally, the most available power supply is 120 volts 50/60 hertz. This power source supplies a variable transformer capable of varying its output from 0 to 140 volts. The output of the variable transformer supplies the primary (low voltage) winding of a 120 volt to 480 volt, 50/60 hertz power transformer. The required power rating of these transformers will depend on the size of the capacitor bank to be tested. In one very large utility where upwards of about 40 capacitor units, rated at 19.9 kV, 150 kVAR, when tested in accordance with the present invention, it was found that a rating of 1.5 kVA was sufficient for the power transformer. The variable transformer should also be sized accordingly and, it is preferable, to provide a 20 ampere rating for the above example.

Capacitors installed in a substation often have voltage ratings much larger than those encountered on distribution poles—upwards of 21,600 volts. Therefore, the transformer is provided with an output of 480 volts for these higher voltage capacitors.

Because an accurate measurement of the voltage applied at the capacitors is required for sensing incipient faults in capacitors, the voltage is measured at the capacitor terminals. However, the variable transformer, which controls the voltage applied to capacitors, may be located at some remote distance from the controls of the power supply/transformer, thus, two separate conductors are provided for measuring the voltage directly at the capacitor location.

The substation capacitor bank consists of individually fused capacitor cans or unit connected in parallel groups. The parallel groups also may be connected in series. All the capacitor cans in a bank, which are normally connected in parallel groups, also may be connected in series. The capacitor cans in a bank which are normally connected in parallel are simultaneously energized with each connection of the test leads from the testing apparatus.

With the parallel capacitor cans energized at the test voltage, the clamp-on/split-core transformer or detection means is positioned around the fused conductor leading to a single capacitor and the current reading is taken by a meter means or ammeter which indicates the magnitude of current through the split-core detection means. This current reading is compared with a chart of acceptable current values for the voltage and kVAR rating of the capacitor being tested. A reading lower than an acceptable current value indicates there is an open circuit or unwanted high resistance within the capacitor unit-can. A reading higher than the acceptable value indicates either a shorted capacitor pack within the unit or a possible low resistance parallel path to ground. For either the high or low current readings, an incipient fault is indicated and the capacitor unit should be replaced. This clamp-on transformer is then placed on each of the leads for the capacitors being tested and the reading and comparison procedure is repeated. It is possible, and sometimes desirable that the meter means or ammeter be used in conjunction with the variable transformer controls—which requires long conductor leads from the split-core transformer to the meter means. This is because the split-core transformer or detection means may be required to be positioned by an operator using long hot sticks from the ground. This permits an operator of the variable transformer controls to record the meter means or ammeter reading when a workman positions the split core transformer around the fused conductor leading to the capacitor can. Use of hot sticks to apply the split-core transformer from the ground results in both convenience and safety.

BRIEF DESCRIPTION OF DRAWINGS

FIG. 1 is an electrical schematic sectional view of a liquid filled power capacitor; and FIG. 2 is a schematic diagram illustrating the components of the test device for individually fused capacitors installed in large blanks, illustrating the positioning of the clamp-on transformer/ammeter for testing the individual capacitors in accordance with the present invention.

DETAILED DESCRIPTION

Referring now to the drawings wherein like numerals have been used throughout the several views to depict the same or similiar parts, in FIG. 1, each single capacitor unit 4 within a capacitor bank 21 (as shown in FIG. 2) consists of a series of groups of parallel connected packs 5, 6, 7, 8 and 9. The failure of an individual capacitor unit 4 may either be an open, a partial short or a complete short of the series of group packs 5, 6, 7, 8 and 9.

The shorted failure mode generally is a step-type failure starting with a dielectric breakdown of one pack, which, in, effect, shorts out one series groups. A shorted pack 9 exposes the remaining series groups of packs to an overvoltage by a factor relating to the numer of series groups and the bank connections. The increased voltage, on each of the remaining series groups of packs, coupled with arcing in the failed pack, will eventually cause breakdown and shorting of another pack, thus resulting in a new step increase in voltage across the remaining packs. This process proceeds until the unit completely fails or a protective device (fuse) clears the unit from the system.

Test data and utility field experience indicates a capacitor unit may exist in a partial failure mode for an extended period of time. Laboratory tests have had units energized at line voltage for a period of one year with one pack shorted during this duration of time. A capacitor with an open pack may exist for an indefinite period of time.

The normal failure mode is a progressive shorting of series groups. The series group pack design of high voltage capacitors 4 also makes it feasible to detect a shorted pack or packs by measuring step increases in current for a specific voltage and frequency. The capacitor unit current increases by a factor relating to the number of series groups. This occurs due to a decrease in impedance as each successive group is shorted. The series groups short because of the previously mentioned overvoltages.

The first series group in capacitors rated 7,600 volts or less are easily detectable with the step increases in current. The above is valid because capacitors are manufactured with a capacitance tolerance of from 100 to 115% of the nameplate at 25° C. and the number of series groups is generally six or less in units rated 7,600 volts or less.

The step increases in current in various combinations of series groups are shown in Table I.

| NUMBER OF SERIES GROUPS IN A CAPACITOR | PER UNIT NAMEPLATE CURRENT RATING | PER UNIT CURRENT INCREASE FOR THE FIRST GROUP SHORTING |
| --- | --- | --- |
| 7 | 1.0 | 1.16 |
| 6 | 1.0 | 1.20 |
| 5 | 1.0 | 1.25 |
| 4 | 1.0 | 1.33 |
| 3 | 1.0 | 1.50 |
| 2 | 1.0 | 2.00 |
| 1 | 1.0 | FULL AVAILABLE FAULT CURRENT |

The first pack failure in a six series group unit provides a 20% increase in current. This 20% increase is greater than the sum of (1) capacitance tolerances, and (2) variations in capacitance through a normal temperature range. Thus, a reliable measurement can be made without knowing the value of the capacitance at time of manufacture, assuming the manufacturer has maintained NEMA Standard tolerances, from 100 to 115% of the nameplate capacity.

For those capacitor units with greater than 6 series groups (normally greater than 7600 volts), definite detection of the first shorted pack-groups requires reference to a measurement of the capacitance value before failure. Detection of a second shorted group is feasible because the differential increase is significantly greater than 116%. The 116% increase (see Table I) for the failure of the first pack is too small a differential to be assured of detection of a failed pack because of previously known tolerances. Thus, reference to a measurement of the capacitance value before failure is required for precise detection of the first shorted groups.

The pack configuration in high voltage capacitors may vary from 1 to 13 series groups depending upon the manufacturer and voltage rating of the unit.

An open pack 6 (FIG. 1) is a pack which has been disconnected from the circuit by either a mechanical failure or a lighting surge. An open pack decreases the capacitance of the capacitor unit 4, which results in a predictable decrease in current.

Open packs which do not lower the rated capacitance below 0.95 per unit of nameplate rating are insignificant, and can continue in service indefinitely. The present invention detects a reduced capacitance below 0.95 per unit. Detection of the first open pack is feasible if the initial manufactured capacitance is known. The aforementioned limitations apply also to commercially available capacitance meters.

Referring now to FIG. 2, the station capacitor test apparatus 10 for individually fused large banks of capacitors is comprised of a transmitter section, 10A, and of a measurement section 10B. The transmitter section 10A includes conductor leads 11 to be connected to a 120 volt 50/60 hertz power source, an input circuit breaker 12, an input current meter means or digital ammeter 13, a variable transformer 14 adjustable from 0 to 140 volts, a 120–480 volt power transformer 15, an output voltmeter means or digital voltmeter 17 and associated electrical conductors or power leads 18 to connect output of transformer 15 to the power capacitor bank 21 to be tested. However, as shown in FIG. 2, use of the input current meter means 13 is optional with the present disclosed capacitor test apparatus 10. The measurement section 10B consists of a clamp/split core transformer 22, which detects the charging current in the fused capacitor leads 20 and measured by a meter means or ammeter circuit device 24.

The operation of the test apparatus may be described as follows: The variable transformer 14 is energized by a 120 or 240 volt 50/60 hertz electric power supply source 3 through the leads 11. The capacitor bank 21 is energized at the prescribed voltage through the 120/480 or 240/480 volt power transformer 15 and power leads 18. Voltage applied at the capacitor bank 21, is read by the voltmeter circuit 17 through separate voltage sensing leads 19 to provide an accurate measurement of the voltage applied at the capacitor terminals through the capacitor bus 30.

The clamp-on transformer 22 is positioned as shown in FIG. 2, and the current read on meter means 24. The meter means 24 is calibrated, as was known in the art. For each capacitor unit rating, there is an acceptable range of current at the exact applied voltage for which the capacitor unit is determined acceptable or unacceptable. The acceptable range of amperes for a specific sized capacitor can is obtained by first observing the manufacture's listed nameplate capacitance, which is 100 percent capacitance value. Because the manufacture's nameplate capacitance possesses a tolerance of between 0 to +15 percent, when a known test voltage, between 120–480 volts, is applied at the capacitor terminal, the resultant current may be calculated, as is well known in the art. The present invention measures the actual current at the capacitor terminal with the known test voltage. This measured current is compared with the acceptable range of 95 to 118 percent of calculated current value. Observed values outside this range indicate defective capacitors.

One suggested test procedure for testing a large bank of individually fused capacitors installed at a substation on an electric utility system with the apparatus previously described is as follows:

The substation operator or mechanic first disconnects the three phase capacitor bank 21 from the high voltage line by opening the switches 25. After waiting a few minutes for the capacitors 21 to discharge through their internal resistors, a temporary ground is applied to ensure that no charge remains on the capacitor 21. Next the ground is removed and the test circuit 10A is connected to those capacitor units in one phase which are connected in parallel 21 by means of leads 18 and 19 and the clamps 26. The input to the test circuit 10A is energized by connecting the input lead 11 to a 120 or 240 volt AC source at the substation. The substation operator or mechanic energizes the variable transformer 14 by closing circuit breaker 12 and then adjusting the variable transformer 14 while he reads the test voltage 17 and, preferably, observing the digital ammeter 13.

With the capacitor bank 21 energized at the test voltage, the operator or mechanic positions the clamp-on transformer 22 around the fuse lead 20 connecting the capacitor 4 to the capacitor bus 30 and the neutral 31 uses the ammeter 24 to read the current taken on each individual capacitor 4. As set forth above, higher than acceptable measured current indicates either one or more shorted capacitor packs within the capacitor unit 4 or a possible leakage path to ground. A lower than acceptable measured current indicates one or more open capacitor packs within capacitor unit 4. For either the high or low current readings, a possible incipient fault is indicated and the capacitor should be replaced.

It will be seen that the present invention affords a novel and portable apparatus for identifying defective power capacitors installed in large groups and individually fused which is practical, safe, and efficient in operation, and which may be readily applied by a lineman or station mechanic. Moreover, the apparatus allows tests to be performed on the capacitor units 4 without disconnecting the leads 20 from one the capacitor bus 30.

A feature of the power transformer circuit is that the capacitor cans are automatically discharged through the high voltage winding when the voltage applied from the variable transformer primary is reduced to zero. However, capacitors which have blown fuses must first be touch-grounded before handling safely.

Thus, while we have illustrated and described the preferred embodiment of our invention, it is to be understood that this is capable of variation and modification and we, therefore, do not wish to be limited to the precise details set forth, but desire to avail ourselves of such changes and alterations as fall within the purview of the following claims.

We claim:

1. A method for testing an individual capacitor, which is part of a capacitor bank in a substation, for detecting faults in the capacitor without disconnecting the capacitor from the capacitor bank comprising the steps of:
   a. applying an alternating voltage variable from 0 to 480 volts at 50/60 hertz of a predetermined magnitude to a capacitor bank, wherein the magnitude of the predetermined voltage is measured at the terminals of the capacitor bank;
   b. measuring the value of the portion of total charging current entering the capacitor bank which enters the individual capacitor without disconnecting the individual capacitor from the capacitor bank by means of a split magnetic core probe having a distributed winding around the case and having an accuracy of about 3 percent of the true measured value; and
   c. comparing the measured value of the charging current through the individual capacitor with the known allowable values for the individual capacitor reactive power rating for applied predetermined alternating voltage, thereby detecting an incipient fault in the capacitor tested when the measured charging current is outside the range of the known allowable value.

2. An apparatus for detecting incipient faults in an individual capacitor within a capacitor bank, having a common phase bus and a common neutral bus including in combination:
   a variable transformer having an input rating of 120 volts at 50/60 hertz and an output voltage variable from 0 to 140 volts and sized to the total reactive power requirements of the capacitor being tested;
   a power transformer connected to the output of said variable transformer and having an input voltage rating of about 120 volts and an output rating of about 480 volts with a power rating sized to the total reactive power requirements of the capacitor being tested;
   connecting means for supplying alternating output current and voltage of said power transformer to the capacitor bank having individual capacitor units to be tested;
   detection means for setting and measuring a predetermined alternating voltage supplied by said connecting means at the terminals of the capacitor thereby permitting setting and reading a voltmeter in conjunction with the controls of said variable transformer;
   an open and closed type split magnetic core probe positioned about the input lead of the capacitor for sensing the charging current from said power transformer of said connecting means which enters the capacitor being tested; and
   meter means connected to said output probe for indicating the magnitude of the current output from said split magnetic core probe.

3. The apparatus in accordance with claim 2 wherein said split magnetic core probe includes a distributed winding positioned about the input lead of the capacitor with said detection means and said core probe having an accuracy of about 3 percent of the true current value as measured by said meter means.

4. The apparatus in accordance with claim 2 wherein said variable transformer further includes a power rating of between about 0.5 to 2.0 kVA.

5. The apparatus in accordance with claim 2 wherein said connection means includes a pair of current conducting leads.

6. The apparatus in accordance with claim 2 wherein said detection means includes a pair of voltage sensing leads.

7. The apparatus in accordance with claim 2 wherein said meter means is an ammeter.

8. An apparatus for detecting incipient faults in an individual capacitor within a capacitor bank, having a common phase bus and a common neutral bus including in combination:
   a variable transformer having an input rating of 240 volts at 50/60 hertz and an output voltage variable from 0 to 280 volts and sized to the total reactive power requirements of the capacitor being tested;
   a power transformer connected to the output of said variable transformer and having an input voltage rating of about 240 volts and an output rating of about 480 volts with a power rating sized to the total reactive power requirements of the capacitor being tested;
   connecting means for supplying alternating output current and voltage of said power transformer to the capacitor bank having individual capacitor units to be tested;
   detection means for setting and measuring a predetermined alternating voltage supplied by said connecting means at the terminals of the capacitor thereby permitting setting and reading a voltmeter in conjunction with the controls of said variable transformer;
   an open and closed type split magnetic core probe positioned about the input lead of the capacitor for sensing the charging current from said power transformer of said connecting means which enters the capacitor being tested; and
   meter means connected to said output probe for indicating the magnitude of the current output from said split magnetic core probe.

9. The apparatus in accordance with claim 8 wherein said meter means is an ammeter.

10. The apparatus in accordance with claim 8 wherein said split magnetic core probe includes a distributed winding positioned about the input lead of the capacitor with said detection means and said core probe having an accuracy of about 3 percent of the true current value as measured by said meter means.

11. The apparatus in accordance with claim 8 wherein said variable transformer further includes a power rating of between about 0.5 to 2.0 kVA.

12. The apparatus in accordance with claim 8 wherein said connection means includes a pair of current conducting leads.

13. The apparatus in accordance with claim 8 wherein said detection means includes a pair of voltage sensing leads.

* * * * *

UNITED STATES PATENT AND TRADEMARK OFFICE
CERTIFICATE OF CORRECTION

PATENT NO. : 4,536,704

DATED : August 20, 1985

INVENTOR(S) : Merlin E. Burkum and Timothy M. O'Regan

It is certified that error appears in the above-identified patent and that said Letters Patent is hereby corrected as shown below:

Column 3, line 37, delete "procelain" insert --porcelain--;
Column 5, line 41, delete "unit" insert --units--;
Column 6, line 19, delete "blanks" insert --banks--;
Column 6, line 36, after "in" delete ",";
Column 6, line 36, delete "groups" insert --group--;
Column 8, line 25, delete "manufacture's" insert --manufacturer's--;
Column 8, lines 26-27, delete "manufacture's" insert --manufacturer's--;
Column 8, line 61, after "neutral" insert --bus--;
Column 9, line 10, delete "one".

Signed and Sealed this

Fifth Day of November 1985

[SEAL]

Attest:

Attesting Officer

DONALD J. QUIGG

Commissioner of Patents and Trademarks